US005238778A

United States Patent [19]

Hirai et al.

[11] Patent Number: 5,238,778

[45] Date of Patent: Aug. 24, 1993

[54] METHOD OF FORMING PRINTING PLATES BY HEAT TRANSFER

[75] Inventors: Katsura Hirai, Hachioji; Yasuo Kojima, Tama, both of Japan

[73] Assignee: Konica Corporation, Tokyo, Japan

[21] Appl. No.: 744,712

[22] Filed: Aug. 9, 1991

[30] Foreign Application Priority Data

Aug. 13, 1990 [JP] Japan .................................. 2-14119

[51] Int. Cl.$^5$ ......................... G03F 7/00; G03C 11/08

[52] U.S. Cl. .................................... 430/200; 430/300; 430/309; 101/467; 428/195

[58] Field of Search ............... 430/200, 300, 309, 258, 430/257, 302, 157; 428/195; 101/467, 466, 463.1; 156/234, 240, 230, 272.8, 275.5

[56] References Cited

U.S. PATENT DOCUMENTS

| | | | |
|---|---|---|---|
| 3,669,664 | 6/1972 | Adams | 430/309 |
| 3,751,318 | 8/1973 | Newman | 156/234 |
| 3,964,389 | 6/1976 | Peterson | 430/200 |
| 4,245,003 | 1/1981 | Oransky et al. | 430/300 |
| 4,338,007 | 7/1982 | Fromson et al. | 430/328 |
| 4,606,994 | 8/1986 | Illers et al. | 430/300 |
| 4,624,912 | 11/1986 | Zweifel et al. | 430/258 |
| 4,996,093 | 2/1991 | Koshizuka et al. | 428/195 |
| 5,019,452 | 5/1991 | Watanabe et al. | 428/195 |

FOREIGN PATENT DOCUMENTS

| | | | |
|---|---|---|---|
| 160395 | 11/1985 | European Pat. Off. | 101/467 |
| 56-2168 | 1/1981 | Japan | 101/467 |
| 58-193154 | 11/1983 | Japan | 101/467 |
| 59-70572 | 4/1984 | Japan | 101/467 |
| 62-199444 | 9/1987 | Japan | 101/467 |

OTHER PUBLICATIONS

Matsunaga, Kazuo, "Production of repeatedly usable transfer ready medium", JP 60-173365, May 22, 1987.

*Primary Examiner*—Charles L. Bowers, Jr.
*Assistant Examiner*—Martin Angebranndt
*Attorney, Agent, or Firm*—Finnegan, Henderson, Farabow, Garrett & Dunner

[57] ABSTRACT

A method for preparing a printing plate is disclosed. The method comprises contacting a heat sensitive medium, comprising a support and provided thereon a heat transfer layer containing a colorant, a heat fusible substance and a photo-curable composition, with a recording material having a hydrophilic recording surface through the heat transfer layer, applying heat in an image pattern to the contacted materials to transfer the image onto the recording material, and exposing the transferred image to actinic radiation to cure the transferred image.

10 Claims, 1 Drawing Sheet

METHOD OF FORMING PRINTING PLATES BY HEAT TRANSFER

FIELD OF THE INVENTION

The present invention relates to a method of forming printing plates by heat transfer. The present invention is to provide a highly reliable technique which can form printing plates having a good ink receptivity and high printing durability, at a lower energy consumption and lower cost than conventional heat-transfer methods of forming printing plates.

BACKGROUND OF THE INVENTION

In the marked progress being made on information processing systems, there has been rapidly growing, as seen in facsimile communication, the heat transfer technology which thermally transfers information to recording materials such as paper using heat-sensitive media such as heat-sensitive sheets.

It is conceivable to form a printing plate by such heat transfer techniques. Some of proposed heat transfer techniques are those which use laser beams to transfer information to a recording material with a heat-sensitive medium (see Japanese Patent Examined Publication No. 35144/1976). In such proposed laser-based methods for forming printing plates, a heat-sensitive medium having a heat-sensitive layer containing a cellulose-based binder is joined with a recording material, and laser beams are irradiated by signals corresponding to information to be transferred in order to transfer the information thermally to the recording medium, the heat sensitive layer containing the heat-transferred information is then made up into a printing plate. In this method, the resulting printing plate has the transferred heat sensitive layer which is not cured and only a little printing durability.

Printing plates are not a means to only accumulate information transferred thermally; these are for making various printed matters from transferred information. Accordingly, they are required to have a good ink receptivity in order that at the start of printing, they may begin to provide proper printed matters in a shortest time with a minimum paper loss; they are also required to have a printing durability high enough to bear printing in a large amount.

SUMMARY OF THE INVENTION

A first object of the present invention is to provide a printing-plate-forming method capable of making a printing plate at a low energy consumption and at a reduced cost, by solving the foregoing problems. Another object of the present invention is to provide a printing-plate-forming method of heat transfer type, which is low in energy consumption and manufacturing cost and capable of forming a printing plate having a good ink receptivity and a high printing durability.

The foregoing objects of the invention are attained by a printing-plate-forming method based on heat transfer, in which heat-transfer recording is made on a recording surface of recording material having a hydrophilic recording surface, by applying heat to a heat-sensitive medium using a thermal head; and by a printing-plate-forming method based on heat transfer, in which a heat-sensitive medium having a heat-transferable layer containing a photo-curable component is used, and after completion of heat transfer recording to a recording material, the transferred image is subjected to overall exposure for curing the transferred component.

In the printing-plate-forming method of the invention, the heat-transferable layer of the heat-sensitive medium contains a photo-curable component, which is cured by exposure after the heat transfer process. Accordingly, printing plates having good ink receptivity and high printing durability can be formed at a low cost.

DETAILED DESCRIPTION OF THE INVENTION

Figure 1:
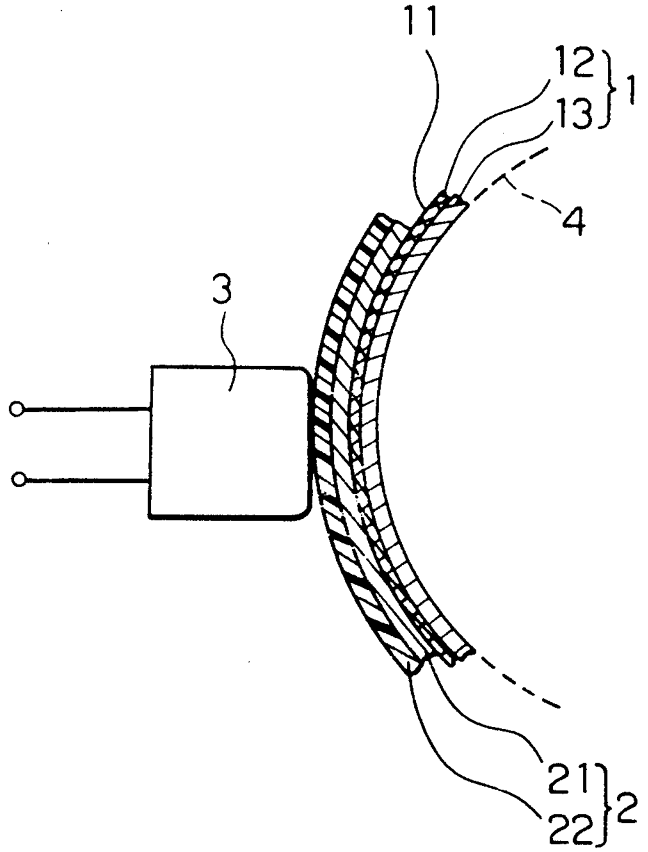
FIG. 1 is a schematic diagram illustrating the concept of the heat transfer; where the figure shows members, respectively 1: recording material, 11: recording surface, 2: heat-sensitive medium, 3: thermal head, 4: pressing means, 12: recording layer, 21: heat-transfer layer, 13: substrate, and 22: support.

In the invention, the recording material which forms a printing plate has a hydrophilic recording surface. As such a recording material, there can be used, for example, a metal plate or synthetic resin sheet laminated with metal foil (e.g., polypropylene sheet laminated with aluminium foil). The surface of said recording material must be hydrophilic; therefore, the surface of a metal plate for recording material, such as an aluminium plate, may be subjected to a treatment for imparting hydrophilicity.

In the invention, the heat transfer recording is carried out with a thermal head or a laser beam. And as a constituent of the heat-sensitive medium, a selectively heat-transferable substance is used. For example, a lipophilic layer containing a photo-curable component is formed on a support as a heat-sensitive medium, and after placing it in contact with a recording material, the heat-transferable substance is thermally transferred to the hydrophilic surface of the recording medium, with a thermal head or a laser beam which operates according to information to be transferred. Thus, a structure to form a printing plate is obtained.

In selecting a hydrophilic support to form a recording medium having a hydrophilic recording surface of the invention, it is preferable that said hydrophilic support be a dimensionally stable support subjected to a surface treatment for hydrophilicity.

Examples of suitable supports include paper; paper laminated with plastics such as polyethylene, polypropylene, and polystyrene; plastic film such as cellulose diacetate, cellulose triacetate, cellulose propionate, cellulose butyrate, cellulose butyrate-acetate, nitrocellulose, polyethylene terephthalate, polyethylene, polypropylene, polystyrene, polycarbonate and polyvinylacetal; paper or plastic film laminated with aluminium or zinc; hydrophilic metal supports such as alminium plates, zinc plates, iron plates subjected to a surface treatment such as chrome plating, bimetal plates including copper-aluminium plates, copper-stainless steel plates, chromium-copper plates, and trimetal plates including chromium-copper-aluminium plates, chromium-copper-iron plates, chromium-copper-stainless steel plates; or tri-layered boards having hydrophilic surfaces including resin sheets sandwiched with metal plates such as aluminium. Among these supports, aluminium plates are preferable.

When supports having plastic faces are used, it is preferable that these supports be subjected to a surface treatment such as chemical treatment, electric discharge treatment, flame treatment, ultraviolet treatment, high frequency glow discharge treatment or active plasma treatment. For paper supports or plastic supports, it is preferable to subject them to a surface treatment for hydrophilicity. A preferable example of such surface treatment for hydrophilicity is to roughen the surface of the supports by coating using a coating solution prepared by dispersing a hydrophilic particles such as colloidal silica in a hydrophilic resin.

In case recording bases have aluminium faces, there are preferably used surface treatments such as roughening; dipping in an aqueous solution of sodium silicate, potassium fluorozirconate or phosphate; and anodizing. Also, there may be favorably employed an aluminium plate subjected to roughening and then dipping in an aqueous solution of sodium silicate as described in U.S. Pat. No. 2,714,066; and an aluminium plate subjected to anodizing and then treated in an aqueous solution of alkali metal silicate as described in Japanese Patent Examined Publication No. 5125/1972.

The roughening of aluminium surface can be performed by electrolytic etching in a solution of an electrolyte such as hydrochloric acid, nitric acid, sulfuric acid or phosphoric acid, or by mechanical polishing such as ball polishing, brush polishing, press polishing or horning.

The anodizing can be performed, for example, by applying an electric current to an electrolytic bath comprising, singly or in combination, an aqueous or non-aqueous solution of inorganic acid such as phosphoric acid, chromic acid, sulfuric acid or boric acid, or organic acid such as oxalic acid or sulfamic acid, using an aluminium plate as the anode.

The amount of oxide film formed by this anodizing is preferably 10 to 50 mg/dm$^2$, and further, such an anodized aluminium plate is preferably subjected to sealing treatment with hot water, silicates, phosphates or fluorozirconates.

Further, useful surface treatments include a silicate electro-deposition treatment disclosed in U.S. Pat. No. 3,658,662 and a treatment with polyvinylphosphonic acid described in German Offenlegungshrift 1,621,478. According to the invention, a heat sensitive layer is transferred to a recording material using a thermal head or a laser beam.

In the invention, the term "thermal head" means a device to form necessary records by selectively heat-transferring a heat-sensitive medium to a recording material according to information to be transferred. The structure of such a thermal head may be arbitrarily selected; but in general, there is provided an exothermic resistor element having a structure corresponding to the information to be transferred. For example, in case where such information is to be outputted in characters, there is preferably employed an exothermic resistor element capable of generating heat in a dot element matrix. The laser used in the invention includes, YAG laser, Ar laser, He-Ne laser and semiconductor laser.

FIG. 1 illustrates a schematic diagram of an embodiment of the invention, where recording material surface 11 of recording material 1 is contacted with heat-transfer layer 21 (heat-melt composition layer) of heat-sensitive medium 2 (or heat-sensitive sheet), while this composite is held between thermal head 3 and pressing means 4 (pinch roller, etc.), dot-heating is applied thereto with thermal head 3 according to information so that a heat-transfer layer corresponding to the information is transferred to recording material 1. Heat-transfer layer 21 may use a composition containing a photo-curable component. In such an embodiment, the heat transfer can be favorably performed at about 80° C., or at most 200° C. even when a high temperature is used. The transfer can also be performed at temperatures within the range of 70° to 200° C. In the figure, 22 is a support for heat-sensitive medium 2.

In the invention, the heat-transfer layer of the heat-sensitive medium may contain a photo-curable component. Preferably, the heat-sensitive medium is obtained in the form of heat-sensitive sheet, in which a heat-transfer layer consisting of a heat-transferable composition is formed on a film support.

The heat-transfer layer of the invention contains a photo-curable component, and further it may also contain a binder, particularly a heat-fusible binder, and a physical property modifier such as softening agent.

The photo-curable compound, which may be contained in the heat-transfer layer, may be any of conventional materials of this kind. Usable photo-curable compositions include all of those monomers, prepolymers and polymers which change in a short time their respective molecular structures to ones having a higher physical strength or a better adhesion to the substrate when irradiated by active rays.

The following photo-curable compositions are used for the present invention. For example, it is possible to use diazo resins exemplified by condensation products of aromatic diazonium salts and formaldehyde. The examples of especially preferable diazo resins include diazo resin inorganic salts obtained by reaction of the above condensation product and a salt, such as hexafluorophosphate, tetrafluoroborate, perchlorate or periodate, of the condensation product of p-diazodiphenylamine and formaldehyde or acetaldehyde; diazo resin organic salts obtained by reaction of the above condensation product and sulfonic acid as disclosed in U.S. Pat. No. 3,300,309. The diazo resin is preferably used in combination with a binder. Various high polymer compounds can be used as binders for this purpose. The examples of preferable binders include copolymers of a monomer having an aromatic hydroxy group, such as N-(4-hydroxyphenyl)acrylamide, N-(4-hydroxyphenyl)methacrylamide, o-, m-, or p-hydroxystyrene, o-, m- or p-hydroxyphenyl methacrylate and other monomer, as disclosed in Japanese Patent O.P.I. Publication No. 98613/1979, polymers consisting mainly of repeat units of hydroxyethyl acrylate or hydroxyethyl methacrylate, as disclosed in U.S. Pat. No. 4,123,276, natural resins such as shellac and rosin, polyvinyl alcohol, the polyamide resin disclosed in U.S. Pat. No. 3,751,257, the linear polyurethane resin disclosed in U.S. Pat. No. 3,660,097, polyvinyl alcohol phthalate resin, epoxy resins obtained by condensation of bisphenol A and epichlorohydrin, and celluloses such as cellulose acetate and cellulose acetate phthalate.

Mention may also be made of photo-curable composition consisting mainly of a light sensitive polymer having $$-CH=CH-\underset{\underset{O}{\|}}{C}-$$

as the light sensitive group in its polymer main chain or side chain, such as polyesters, polyamides and polycarbonates. The examples of such light sensitive materials include light sensitive polyesters obtained by condensation of phenylenediethyl acrylate, hydrogenated bisphenol A and triethylene glycol, as disclosed in Japanese Patent O.P.I. Publication No. 40415/1980, and light sensitive polyesters derived from a (2-propylidene) malonic acid compound such as cinnamylidenemalonic acid and a bifunctional glycol, as disclosed in U.S. Pat. No. 2,956,878.

Mention may also be made of aromatic azide compounds in which the azide group is bound to the aromatic ring directly or via a carbonyl or sulfonyl group. The examples of the aromatic azide compound include polyazidestyrene, polyvinyl-p-azidobenzoate, and polyvinyl-p-azidobenzal, as disclosed in U.S. Pat. No. 3,096,311; the reaction product of azidoarylsulfanyl chloride and unsaturated hydrocarbon polymer disclosed in Japanese Patent Examined Publication No. 9613/1970; and polymers having sulfonylazide or carbonylazide as disclosed in Japanese Patent Examined Publication Nos. 21067/1968, 229/1969, 22954/1969 and 24915/1970.

Mention may also be made of photopolymerizable compositions comprising an addition-polymerizable unsaturated compound. The examples of the unsaturated monomer that can be used for this purpose include acrylates or methacrylates of alcohols (e.g. ethanol, propanol, hexanol, octanol, cyclohexanol, ethylene glycol, propylene glycol, diethylene glycol, triethylene glycol, tetraethylene glycol, polyethylene glycol, glycerol trimethylolpropane, pentaerythritol); reaction products of glycidyl acrylate or glycidyl methacrylate with amines (e.g. methylamine, ethylamine, butylamine, benzylamine, ethylenediamine, diethylenetriamine, hexamethylenediamine, xylilenediamine, dimethylamine, diethylamine, ethanolamine, diethanolamine, aniline ); reaction products of glycidyl acrylate or glycidyl methacrylate with carboxylic acids (e.g. acetic acid, propionic acid, benzoic acid, acrylic acid, methacrylic acid, succinic acid, maletic acid, phtalic acid, tartaric acid, citric acid); amide derivatives (e.g. acrylamide, methacrylamide, N-methylolacrylamide, methylenebisacrylamide); and reaction products of acrylic acid or methacrylic acid with epoxy compounds.

The examples of substances which can be used as a photo-initiator include benzoin derivatives such as benzoin methyl ether, benzoin isopropyl ether and α,α-dimethoxy-α-phenylacetophenone; benzophenone and its derivatives such as 2,4-dichlorobenzophenone, methyl o-methyl o-benzoylbenzoate, 4,4'-bis(diethylamino) benzophenone and 4,4'-bis(diethylamino) benzophenone; thoxanthone derivatives such as 2-chlorothioxanthone and 2-isopropylthioxanthone; anthraquinone derivatives such as 2-chloroanthraquinone and 2-methylanthraquinone; acridone derivatives such as N-methylacridone and N-butylacridone; α,α-diethoxyacetophenone; benzyl; fluorenone; xanthone; uranyl compounds; and halogen compounds.

It is preferable to add a binder to this photopolymerizable composition. The above-mentioned substances used as the binder in diazo resins can be used as the binder in the case as well.

It is preferable that the heat-transfer layer of the invention be lipophilic. The heat transfer layer of the invention contains a photo curable composition, and further contains a binder consisting of a heat fusible substance in order to ensure heat-transferring of the photo-curable compositions.

Heat-fusible substances used in the heat-transfer layer are those substances which are solid or semi-solid at room temperature and have a melting point (measurement by the Yanagimoto MPJ-2 method), or a softening point (measurement by the ring and ball method) of 25° to 120° C., preferably 40° to 120° C. Examples thereof include vegetable waxes such as carnauba wax. Japan wax; animal waxes such as beeswax, insect wax, shellac wax, whale wax; petroleum waxes such as paraffin wax, microcrystalline wax, ester wax, oxidized wax; and mineral waxes such as montan wax, ozokerite, ceresine wax. Other usable examples are higher fatty acids such as palmitic acid, stearic acid, margaric acid, behenic acid; higher alcohols such as palmityl alcohol, stearyl alcohol, behenyl alcohol, margaryl alcohol, myricyl alcohol, eicosanol; higher fatty esters such as cetyl palmitate, myricyl palmitate, cetyl stearate, myricyl stearate; amides such as acetamide, propionamide, palmitamide, stearamide, amide wax; rosin derivatives such as ester gum, rosin-maleic acid resin, rosin-phenolic resin,, hydrogenated rosin; polymers such as phenol resin, terpene resin, xylene resin, low molecular weight polystyrene, petroleum resin, aromatic hydrocarbon resin, ethylene-vinyl acetate copolymer, ethylene-ethyl acrylate copolymer, styrene-butadiene copolymer, ionomer resin, polyamide resin, polyester resin, epoxy resin, polyurethane resin, acrylic resin, vinyl chloride resin, cellulose-type resin, polyvinyl alcohol, styrene-type resin, isoprene rubber, chloroprene rubber, natural rubber; and higher amines such as stearylamine, behenylamine, palmitylamine. Further, there may also be used hot-melt components solid at room temperature described in Japanese Patent O.P.I. Publication No. 6825/1979 and vehicles described in Japanese Patent O.P.I. Publication No. 105579/1980.

These heat-fusible substances can be advantageously used because of their capability of being readily made up into a dispersion.

These heat-fusible substances may be used singly or in combination.

The ratio of respective components in the heat-transfer layer is not particularly limited, but it is preferable that the photo-curable component be contained at a ratio of 20 to 80 wt. %.

A colorant may be added in the heat-transfer layer when necessary. The content of a colorant is preferably less than 20 parts by weight per 100 parts by weight of the solid material contained in the heat-transfer layer. The preferred colorant is carbon black; other inorganic pigments, organic pigments and organic dyes are also usable. Examples of useful inorganic pigments are titanium dioxide; zinc oxide; Prussian blue; cadmium sulfide; iron oxide; and zinc, barium and calcium chromates. Examples of useful organic pigments include pigments of azo, thioindigo, anthraquinone, anthranthrone and triphenedioxazine types; vat dye pigments ; phthalocyanine pigments (for example, copper phthalocyanine and its derivatives); and quinacridone pigments.

As organic dyes, there may be used acid dyes, direct dyes, dispersion dyes, oil-soluble dyes and metal-containing oil-soluble dyes.

The heat-transfer layer may contain various additives other than the above compounds. For example, vegetable oils such as castor oil, linseed oil, olive oil; animal oils such as whale oil; and mineral oils may be added. Further, surfactants of anionic, cationic, nonionic or amphoteric type may also be favorably used.

The thickness of the heat-transfer layer is generally 0.5 to 3.5 μm, preferably 1.5 to 3.0 μm and especially 1.7 to 2.7 μm.

In the invention, it is preferable that the support used in the heat-sensitive medium be high in heat strength, dimensional stability and surface smoothness. Suitable materials are, for example, papers such as ordinary paper, condenser paper, laminated paper, coated paper; resin films such as polyethylene, polyethylene terephthalate, polystyrene, polypropylene, polyimide; paper-resin composites; and metal sheets such as alminium foil. The thickness of the support is preferably less than 60 μm and especially 1.5 to 15 μm, in order to obtain a good thermal conductivity. In the heat-sensitive medium, the structure of the reverse side of the support may be arbitrarly selected, and a backcoating layer such as antisticking layer may be provided.

The heat-sensitive medium may possess other structural layers such as subbing layer (for adhesion adjusting, etc.) and overcoat layer.

After completion of heat-transfer to the recording material using the heat-sensitive medium, the transferred image is subjected to overall exposure. This exposure can be performed with an active ray corresponding to the photo-curable component. Ultraviolet rays are preferably used as an active ray employing a mercury lamp or metal halide lamp as an irradiation source. Active rays other than ultraviolet rays may also be used.

The printing plate prepared according to the invention is preferably subjected to lacquer treatment.

As a means to improve the printing durability of a printing plate, there is known a treatment to apply a lacquer to the image portion. In embodying the present invention, it is also preferable to perform this lacquer treatment. Lacquers for this purpose can be prepared from phenol or cresol formaldehyde resins and/or epoxy resins. Other useful resinous materials used in lacquer are homopolymers or copolymers having a structural unit of styrene, ortho-, metha- or para-vinyl toluene, or indene; or mixtures of these polymers. Cyclohexanone is favorably used as a solvent. Linseed oil works as a plasticizer. Examples of preferred lacquers can be seen, for example, in British Patent Nos. 968,706, 1,071,163 and Canadian Patent No. 686,284.

EXAMPLE 1

The following coating composition was coated, with a wire bar, on a 3.5-μm-thick polyethylene terephthalate film to a dry coating thickness of 3 μm. Thus, a heat-sensitive medium provided with a heat-transfer layer, or a heat-sensitive transfer ribbon, was prepared.

| | |
|---|---|
| Carbon black (#30, product of Mitsubishi Kasei) | 20 parts by weight |
| Carnauba wax | 60 parts by weight |
| Pentaerythritol tetracrylate | 20 parts by weight |
| Diisopropyl thioxanthone | 2 parts by weight |
| Isoamyl dimethylaminobenzoate | 1 part by weight |
| Xylene | 100 parts by weight |

There was applied an energy of 3 mj/dot to this heat-transfer ribbon to record on a recording sheet as the recording material, with a thermal printer having a thermal head (thin layer serial head having an exothermic element density of 7 dot/mm, printing pressure: 600 g/head). The recording sheet used was an aluminium-foil-laminated polypropylene sheet, which was roughened and subjected to surface treatment for hydrophilicity before being used.

The resulting sheet recorded above was then subjected to overall exposure for 5 seconds with a metal halide lamp, while adjusting the plate face illumination energy at 100 $mW/cm^2$.

The printing plate prepared as above was mounted on a sheet-fed offset printer. After the start of printing, a sufficient image density was obtained at the 20th printing matter, and more than 50,000 printing matters were further obtained in good quality.

EXAMPLE 2

An aluminium foil was laminated on a polypropylene sheet, and the aluminium surface was roughened, followed by hydrophilic treatment. Thus the recording sheet was obtained. The resulting sheet was contacted with the heat-sensitive transfer ribbon of the Example 1, and the contacted materials were exposed from the side of the polyethyleneterephthalate to YAG laser beam of 2 W condensed to 30μ, scanning at a speed of 300 m/second.

A transfer layer of the portion exposed to the laser beam was transferred to the recording sheet. The resulting recording sheet was then exposed to a metal-halide lamp at an intensity of 100 $mw/cm^2$ on the surface of the recording sheet for 5 seconds. Thus the printing plate was obtained.

The printing plate was mounted on the printing press, and printing was carried out. A sufficient image density was obtained at the 20th printing matter, and more than 50,000 printing matters were further obtained in good quality.

EXAMPLE 3

A coating solution described below was coated on a 3.5μ thick polyethyleneterephthalate using a wire bar to be 3μ thick. Thus the heat-sensitive transfer ribbon was obtained.

| Coating solution | |
|---|---|
| Carbon black (#30, produced by Mitsubishi Chemical Co.) | 20 parts by weight |
| Polyethylene (low molecular weight) | 60 parts by weight |
| Diazo resin | 5 parts by weight |
| 2-hydroxyethylmethacrylate/ N-(4-hydroxyphenyl)-methacrylamide/methacrylic acid (40/55/5, molar ratio) copolymer | 30 parts by weight |
| Xylene | 100 parts by weight |

The ribbon obtained above was contacted with the recording sheet of Example 2, and the contacted materials were processed in a similar manner as in Example 2. Thus the printing plate was obtained. The printing plate was mounted on the printing press, and printing was carried out. A sufficient image density was obtained at the 20th printing matter, and more than 50,000 printing matters was further obtained in good quality.

EXAMPLE 4

A coating solution described below was coated on a 3.5μ thick polyethyleneterephthalate using a wire bar to be 3μ thick. Thus the heat-sensitive transfer ribbon was obtained.

| Coating Solution | |
|---|---|
| Carbon black | 20 parts by weight |

-continued

| Coating Solution | |
|---|---|
| (#3, produced by Mitsubishi Chemical Co.) | |
| Paraffin wax | 60 parts by weight |
| copolycondensate of p-phenylenediacrylic acid ester and 1,4-dihydroxyethyloxy cyclohexane | 30 parts by weight |
| 1-Methyl-2-benzoylmethylene-β-naphthothiazoline | 2 parts by weight |
| Xylene | 100 parts by weight |

The ribbon obtained above was contacted with the recording sheet of Example 2, and the contacted materials were processed in a similar manner as in Example 2. Thus the printing plate was obtained. The printing plate was mounted on the printing press, and printing was carried out. A sufficient image density was obtained at the 20th printing matter, and more than 50,000 printing matters was further obtained in good quality.

COMPARISON 1

A heat-sensitive ribbon was prepared in the same manner as in Example 1, except that pentaerythritol tetracrylate, diisopropyl thioxanthone and isoamyl dimethylaminobenzoate were removed from the heat-transfer layer composition. Then, the heat-transfer recording and overall exposure were performed likewise to prepare a printing plate. When printing was started after mounting this comparative printing plate on the sheet-fed offset printer used in Example 1, more than 100 sheets of paper were lost until a properly printed sheet was obtained. Moreover, the image portion began to separate from the support at about twenty thousandth sheet, and the printed image came to be partly missing after that.

What is claimed is:

1. A method for preparing a printing plate comprising:

contacting (1) a heat sensitive medium, comprising a support and provided thereon a heat transfer layer containing a colorant, a heat fusible substance having a melting point or a softening point of 25° to 120° C. and a photo-curable composition, with (2) an aluminum plate, and through the heat transfer layer, applying heat of about 80° to 200° C. in an image pattern to the contacted materials to transfer the image onto the aluminum plate, and exposing the transferred image on the aluminum plate, to UV radiation to cure the transferred image.

2. The method of claim 1, where heat is applied by means of a thermal head, and wherein the temperature of said thermal head is within the range of 80° to 200° C.

3. The method of claim 2, wherein said heat fusible substance is a wax or a polymeric resin.

4. The method of claim 1, wherein said applying heat comprises using a laser beam.

5. The method of claim 1, wherein said photo-curable composition is selected from a photo-polymerizable composition, a photo-crosslinking composition and diazo resin containing compositions.

6. The method of claim 1, wherein said heat transfer layer contains the colorant in an amount of less than 20% by weight.

7. The method of claim 1, wherein said colorant is carbon black.

8. The method of claim 1, wherein a lacquer is applied to the cured transferred image.

9. The method of claim 1, wherein said heat fusible substance is substantially free of olefinic double bonds capable of undergoing polymerization.

10. The method of claim 1 wherein said heat fusible substance is a wax or a polymeric resin.

* * * * *